US011736071B2

(12) United States Patent
Mittal et al.

(10) Patent No.: US 11,736,071 B2
(45) Date of Patent: Aug. 22, 2023

(54) WIDEBAND AMPLIFIER

(71) Applicant: QUALCOMM Incorporated, San Diego, CA (US)

(72) Inventors: Ayush Mittal, Bangalore (IN); Sreenivasa Mallia, Bangalore (IN); Arpit Gupta, San Diego, CA (US); Krishnaswamy Thiagarajan, Bangalore (IN); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 288 days.

(21) Appl. No.: 17/208,864

(22) Filed: Mar. 22, 2021

(65) Prior Publication Data

US 2022/0302883 A1 Sep. 22, 2022

(51) Int. Cl.
*H03F 1/22* (2006.01)
*H03F 1/42* (2006.01)
*H03F 3/24* (2006.01)

(52) U.S. Cl.
CPC .............. *H03F 1/42* (2013.01); *H03F 3/245* (2013.01); *H03F 2200/09* (2013.01); *H03F 2200/36* (2013.01); *H03F 2200/451* (2013.01)

(58) Field of Classification Search
CPC ........................................................ H03F 1/22
USPC ................................................. 330/311, 253
See application file for complete search history.

(56) References Cited

U.S. PATENT DOCUMENTS

| 7,312,662 B1 * | 12/2007 | Roo ................ H03F 3/265 330/253 |
| 8,994,455 B2 * | 3/2015 | Kim ................. H03F 3/19 330/207 P |
| 2010/0041361 A1 | 2/2010 | Ojo |
| 2016/0173044 A1 * | 6/2016 | Zhou ............... H03F 1/086 330/253 |
| 2021/0058102 A1 | 2/2021 | Park et al. |

OTHER PUBLICATIONS

International Search Report and Written Opinion—PCT/US2022/070898—ISA/EPO—dated Jun. 14, 2022.

* cited by examiner

*Primary Examiner* — Henry Choe
(74) *Attorney, Agent, or Firm* — Patterson+ Sheridan, L.L.P.

(57) ABSTRACT

Certain aspects of the present disclosure provide an amplifier. The amplifier generally includes an amplifier core circuit configured to amplify a radio frequency signal and having a first output and a second output; a transformer coupled to the amplifier core circuit, the transformer having a primary winding and a secondary winding, the primary winding being coupled to the first output and the second output of the amplifier core circuit, the secondary winding being coupled to an output node of the amplifier; and a variable resistance circuit coupled in parallel with the primary winding.

20 Claims, 7 Drawing Sheets

WIDEBAND AMPLIFIER

BACKGROUND

Field of the Disclosure

Certain aspects of the present disclosure generally relate to electronic components and, more particularly, an amplifier.

Description of Related Art

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. A base station and mobile station may each include radio frequency front-end (RFFE) circuitry for processing and amplifying signals for transmission and reception. For example, the RFFE circuitry may include a power amplifier (PA) for amplifying a radio frequency signal for transmission. Moreover, a driver amplifier (DA) may be used to generate signals to drive an input of the PA.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reducing a voltage standing wave ratio (VSWR).

Certain aspects of the present disclosure provide an amplifier. The amplifier generally includes an amplifier core circuit configured to amplify a radio frequency signal and having a first output and a second output; a transformer coupled to the amplifier core circuit, the transformer having a primary winding and a secondary winding, the primary winding being coupled to the first output and the second output of the amplifier core circuit, the secondary winding being coupled to an output node of the amplifier; and a variable resistance circuit coupled in parallel with the primary winding.

Certain aspects of the present disclosure provide a method for generating an amplified signal. The method generally includes receiving a differential input signal at inputs of an amplifier core circuit; amplifying, via the amplifier core circuit, the differential input signal to generate the amplified signal at an output node, wherein the amplifier core circuit is coupled to a primary winding of a transformer, a secondary winding of the transformer being coupled to the output node; and configuring a resistance associated with a variable resistance circuit based on an operating frequency of the amplifier core circuit, the variable resistance circuit being coupled in parallel with the primary winding.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to electronic components and, more particularly, an amplifier (e.g., a driver amplifier or "DA") implemented with a transformer having a resistive element across a primary side of the transformer. In some aspects, the resistive element is used for managing a voltage standing wave ratio (VSWR) associated with the amplifier. For example, a variable resistance circuit may be coupled in parallel with a primary winding of the transformer, and controlled for impedance matching to reduce the VSWR associated with the amplifier, as described in more detail herein.

Example Wireless Communications

Figure 1:
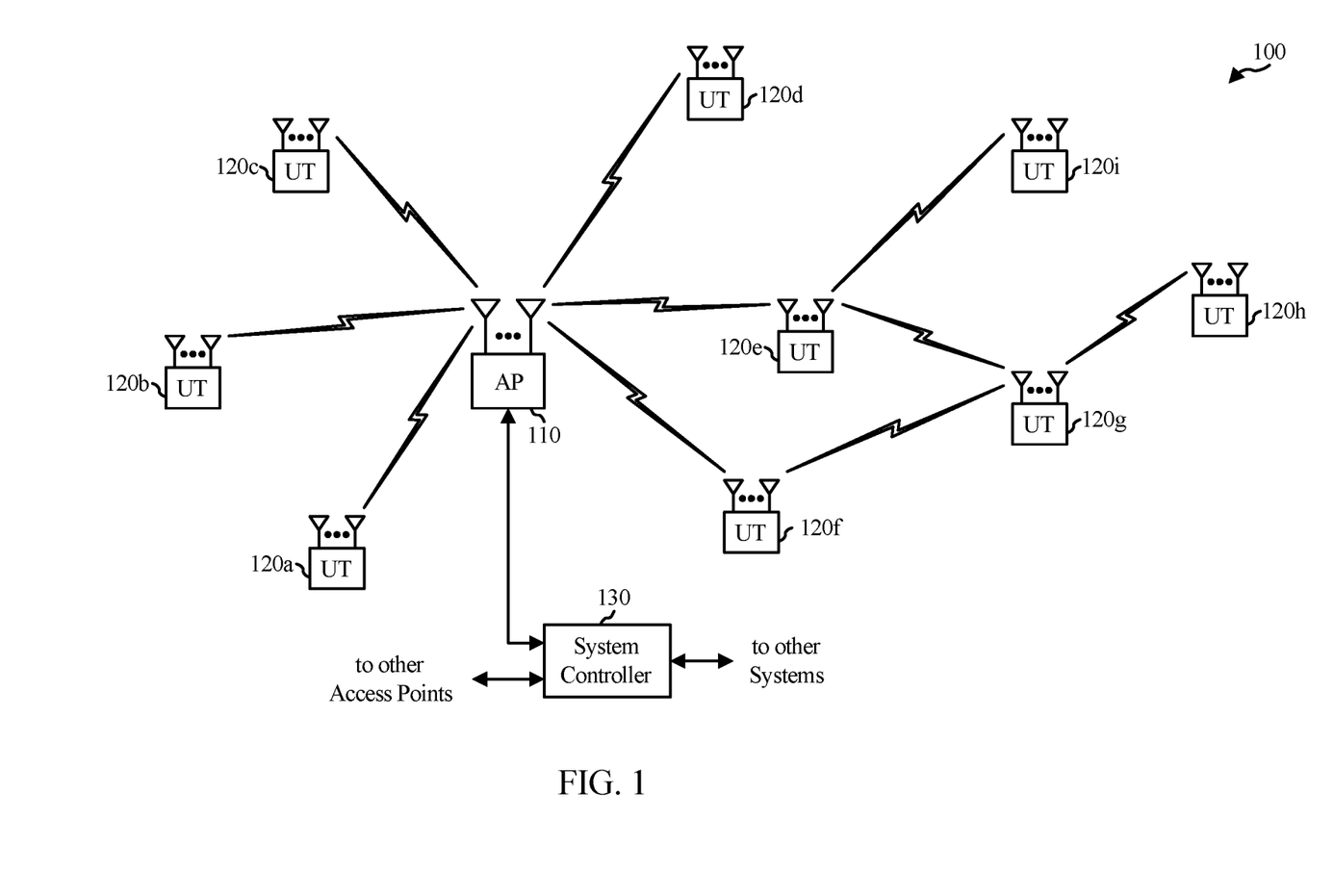
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, a smart home device, a medical device, a communication device in an automobile, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions, and/or for MIMO operation in either of the downlink or uplink. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include an amplifier having a transformer and a variable resistance circuit coupled to a primary winding of the transformer (e.g., for managing VSWR), as described in more detail herein.

Figure 2:
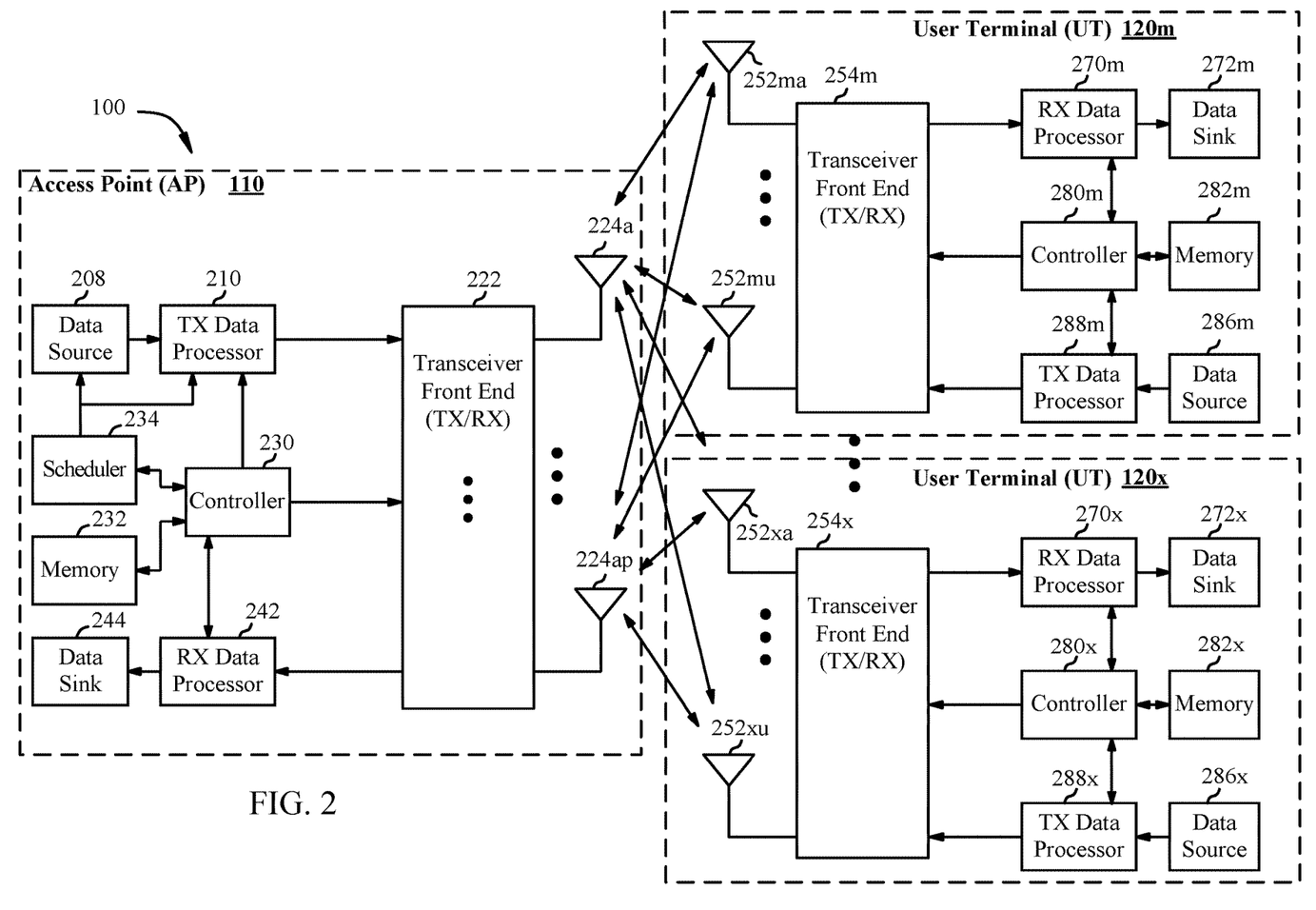
FIG. 2 is a block diagram of an example access point (AP) and example user terminals, in accordance with certain aspects of the present disclosure.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and/or control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one or more of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one or more of the $N_{ut,m}$ antennas, for example for transmit diversity, via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one or more of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include an amplifier having a transformer and a variable resistance circuit coupled to a primary winding of the transformer (e.g., for managing VSWR), as described in more detail herein.

On the downlink, at access point 110, a TX data processor 210 receives traffic data from a data source 208 for $N_{dn}$ user terminals scheduled for downlink transmission, control data from a controller 230 and/or possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one or more of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224, for example for transmit diversity, via an RF switch, for example. The controller 230 may control the routing within the transceiver front end 222. Memory 232 may store data and program codes for the access point 110 and may interface with the controller 230.

At each user terminal 120, one or more of $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. The decoded data may be provided to a data sink 272 for storage and/or the controller 280 for further processing.

Figure 3:
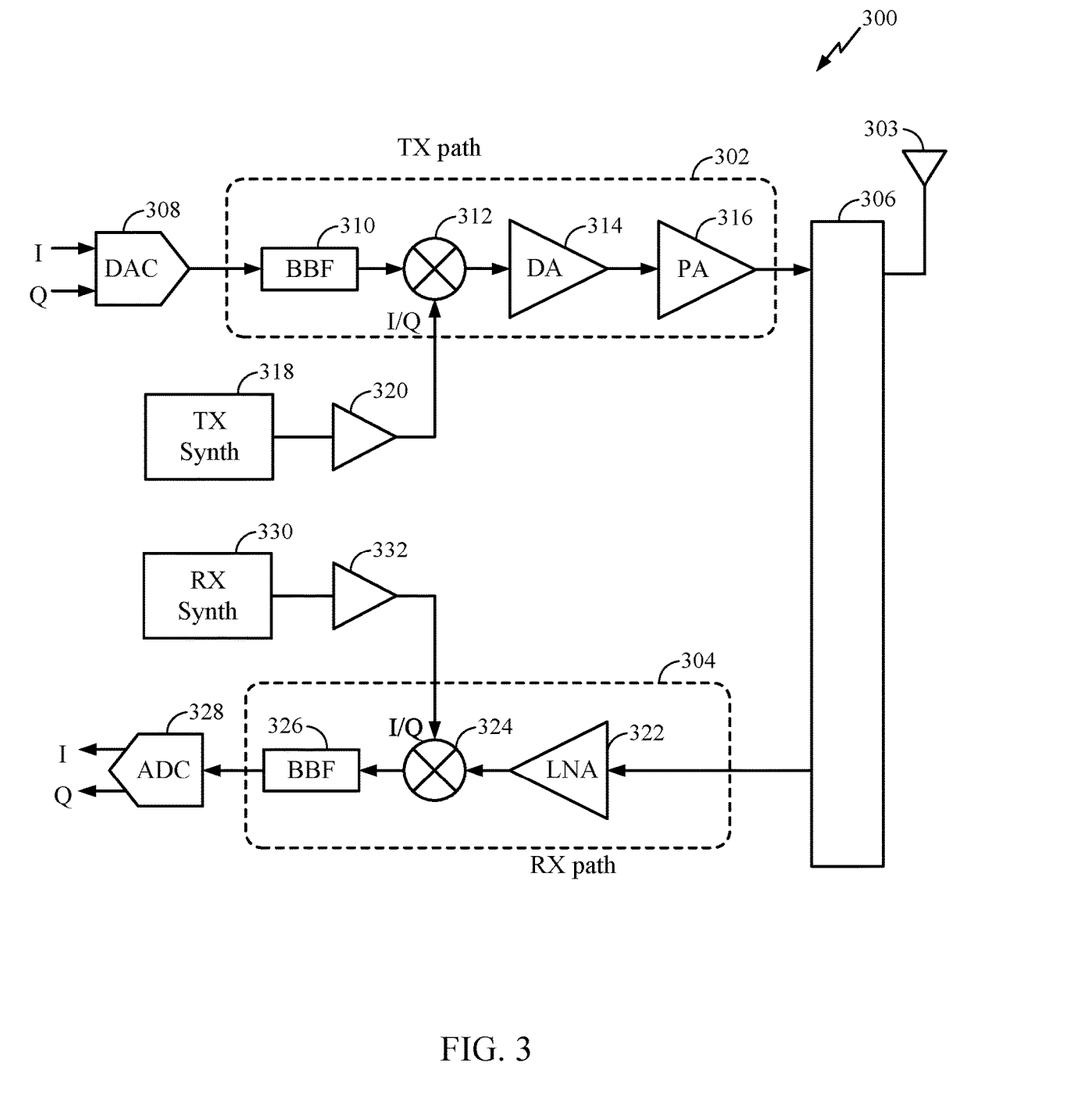
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via one or more antennas. When the TX path 302 and the RX path 304 share an antenna 303 (which may be an example of any of the antennas 224, 252), the paths may be connected with the antenna via an interface 306, which may include any of various suitable RF devices, such as a duplexer, a switch, a diplexer, a filter, and/or the like.

Receiving in-phase (I) or quadrature (Q) baseband analog signals from a digital-to-analog converter (DAC) 308 (which may be included in the front end 222, 254, or included in another component such as the data processor 210, 270 or the controller 230, 280), the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC in some aspects. In such aspects, the RFIC (and thus the DA 314) may be coupled to the PA 316 over one or more interconnections, for example a conductive line or cabling such as a coaxial cable or flex circuit. In other aspects, the DA 314 may be separate from the RFIC, for example integrated into a component or module with the PA 316. A module includes a physical device/assembly, for example comprising one or more circuits packaged together. In some aspects, the DA 314 may include or be coupled to a transformer, and a variable resistance circuit may be coupled to a primary winding of the transformer (e.g., for managing VSWR), as described in more detail herein.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303. While a single upconversion mixer 312 is illustrated, it will be understood that multiple upconversion stages may be implemented. For example, the baseband signals may be upconverted to intermediate frequency signals by a first upconversion stage, and the intermediate frequency signals may be upconverted to the RF range by a second upconversion stage.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components, in some aspects. In other aspects, the LNA 322 or portions thereof are implemented separate from the RFIC. The LNA 322 may include multiple amplification stages in series. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 (which may be included in the front end 222, 254, or included in another component such as the data processor 242, 288) to digital I or Q signals for digital signal processing. While a single downconversion mixer 324 is illustrated, it will be understood that multiple downconversion stages may be implemented. For example, the amplified RF signals may be downconverted to intermediate frequency signals by a first downconversion stage, and the intermediate frequency signals may be downconverted to the baseband frequency by a second downconversion stage.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the signals for transmission in the mixer 312. Similarly, the receive LO frequency may be produced by an RX frequency synthesizer 330, which may be buffered or amplified by amplifier 332 before being mixed with the signals for reception in the mixer 324.

Example Amplifier

Example implementations of an amplifier which includes or has an output coupled to a transformer in accordance with certain aspects of the present disclosure are described below. In such implementations, a variable resistance circuit may be coupled to a primary winding of the transformer. Particular advantages and considerations will be described in this regard with respect to a driver amplifier. Those of skill in the art will understand, however, that implementations are not limited to a driver amplifier. Some aspects described herein may be implemented in any number of different amplifier types. In some aspects, the described amplifier may be any amplifier which is included in a series of amplifiers and outputs to a subsequent amplifier or amplification stage. In such aspects, the transformer (with variable resistance coupled across the primary winding thereof) may be coupled between the described amplifier and the subsequent amplifier or stage, or may be integrated into the described amplifier and coupled to an input of the subsequent amplifier or stage. For example, the described amplifier may be one stage of an LNA (for example, the LNA 322), or included in a transmit or receive path of an integrated circuit configured to process millimeter wave signals (e.g., signals having a frequency of approximately 20 GHz or higher). Further, it will be understood that the described amplifier may be configured to amplify RF signals, for example signals that have been upconverted from a baseband frequency by one or more mixers to an RF frequency, or signals that have been received at an antenna and not yet downconverted from an RF frequency to baseband.

Specifications for a high frequency wideband driver amplifier (DA) typically include the operating frequency range of the DA, the current efficiency of the DA, adjacent channel leakage ratio (ACLR) (e.g., associated with linearity) of the DA, and voltage standing wave ratio (VSWR). VSWR may be improved by impedance matching, and is a measure of how efficiently radio frequency (RF) power is transmitted from a power source, through a transmission line, into a load.

Transmitter (TX) DAs, such as the DA 314 of FIG. 3, may use a transformer as a load for frequency selectivity. The inductance ($L_p$) of the primary winding of the transformer may be determined based on an operating frequency range of the DA, the desired load line impedance, and VSWR. The inductance ($L_s$) of the secondary winding of the transformer may be determined based on the desired load line impedance and VSWR.

To improve current efficiency, a higher load line impedance may be configured. But with a higher load line impedance, the core voltage output swing of the DA may be higher and cause the linearity of the DA to degrade. Therefore, the transformer of the DA may be designed for efficiency at the middle of the operating frequency range. Thus, when operating on the low side of the frequency range, VSWR may improve, but current efficiency may degrade. In contrast, when operating on the high side of frequency range, current efficiency may improve, but VSWR may degrade.

To meet the VSWR specification at higher frequencies, a shunt resistive element may be implemented at the secondary side of the transformer. However, the shunt resistive element may degrade the ACLR of the DA. In other words, after switching in a shunt resistive element at higher frequencies, to keep the output power of the DA constant, the output voltage of the DA is increased. To do so, the voltage at the primary winding ($V_{primary}$) may be increased, which may result in degraded linearity and increased ACLR.

In certain aspects of the present disclosure, a shunt resistive element may be implemented on the primary side of the transformer. By implementing a shunt resistive element at the primary side of the transformer, the shunt resistive element may be switched in at higher frequencies without having to increase $V_{primary}$, avoiding (or at least reducing) the degradation in linearity and ACLR. In other words, by implementing the shunt resistive element at the primary side of the transformer, the ratio of output voltage ($V_{out}$) of the DA to $V_{primary}$ remains approximately constant before and after switching in the shunt resistive element, and therefore, the ACLR of the DA may not degrade.

Figure 4:
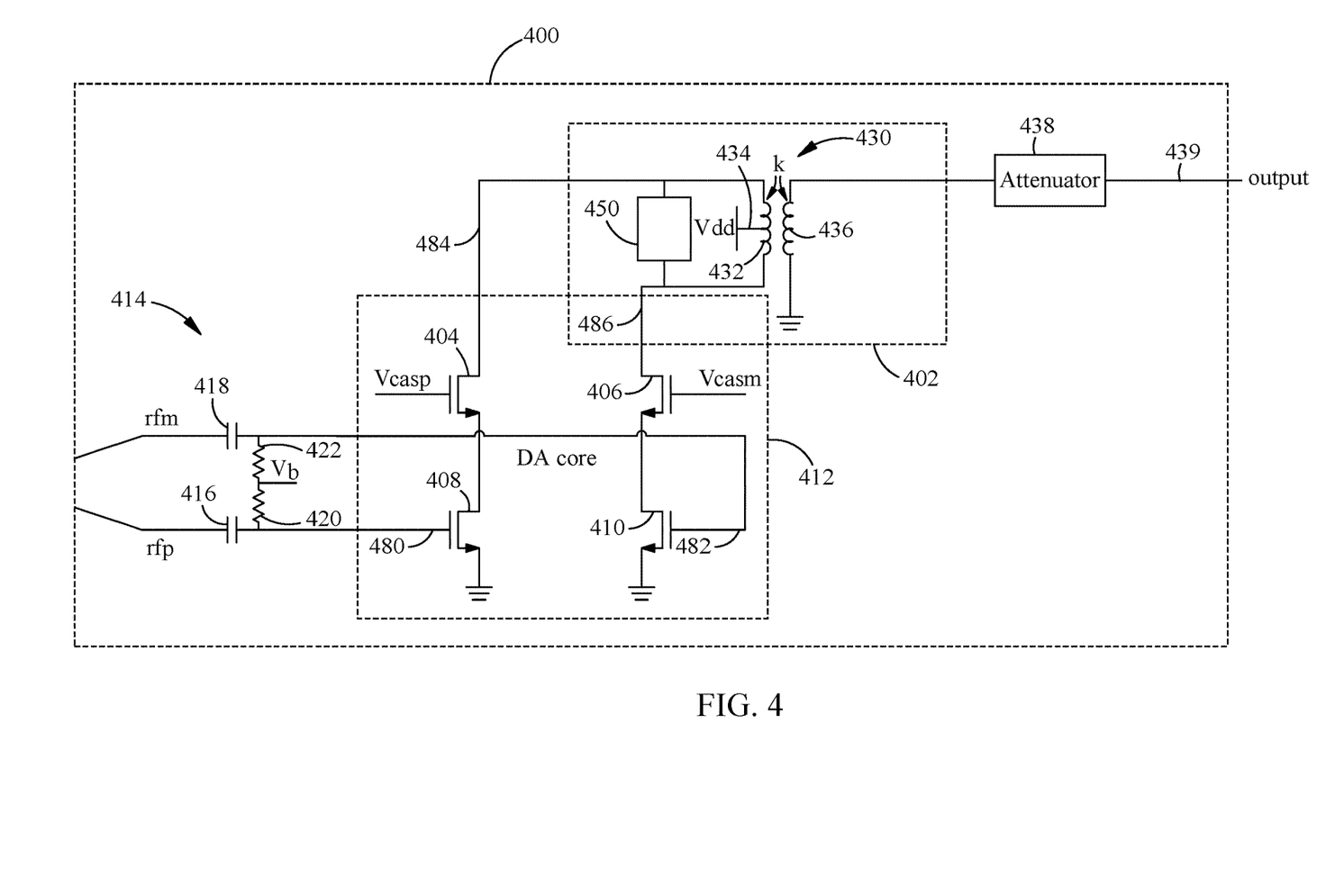
FIG. 4 illustrates a driver amplifier (DA) having a DA load circuit, in accordance with certain aspects of the present disclosure.

FIG. 4 illustrates a DA 400 (e.g., corresponding to DA 314) having a DA load circuit 402, in accordance with certain aspects of the present disclosure. As illustrated, the DA 400 also includes a DA core circuit 412 configured to amplify a differential signal. In the aspect illustrated in FIG. 4, the DA core circuit 412 is configured as a cascode amplifier including transistors 404, 406, 408, 410, each implemented using an n-type metal-oxide-semiconductor (NMOS) transistor. In this aspect, the core circuit 412 includes a positive core input 480 coupled to a gate of the transistor 408 and a negative core input 482 coupled to a gate of the transistor 410. The source of each of the transistors 408, 410 is coupled to ground, and the drains of these transistors are coupled to the sources of transistors 404, 406, respectively. The gates of transistors 404, 406 may be biased using a positive cascode voltage (Vcasp) and a negative cascode voltage (Vcasm), respectively, as illustrated. In some aspects, Vcasp and Vcasm are the same or approximately equivalent. The drains of the transistors 404, 406 may be coupled to a first core output 484 and a second core output 486, respectively.

It will be understood that the DA core circuit 412 may be implemented using an amplifier architecture other than the illustrated cascode architecture. For example, p-type metal-oxide-semiconductor (PMOS) implementations may be used instead of NMOS, or an inverter structure may be used instead of a cascode. When cascode architectures are implemented, additional transistors in each of the positive and negative paths may be included and the gates thereof may be coupled to a bias. For example, an additional transistor may be coupled between the transistor 404 and the first core output 484 such that the source of the additional transistor is coupled to the drain of the transistor 404, the drain of the additional transistor is coupled to the first core output 484, and the gate of the additional transistor is coupled to a bias (voltage).

The gates of the transistors 408, 410 may be controlled via RF input signals at a positive RF input node (rfp) and a negative RF input node (rfm) at differential inputs of circuitry 414. For example, the RF input signals may be received from the mixer 312 (FIG. 3). The positive RF input node rfp and the negative RF input node rfm form a differential input pair. The circuitry 414 includes an alternating-current (AC) coupling capacitor 416 coupled between rfp and the positive core input 480. Moreover, the circuitry 414 includes an AC coupling capacitor 418 coupled between rfm and the negative core input 482. In the aspect illustrated in FIG. 4, the circuitry 414 is configured to provide a voltage Vgmp to the gate of transistor 408 and a voltage Vgmm to the gate of transistor 410. In certain aspects, a resistive element 420 may be coupled between a biasing voltage node (Vb) and the gate of transistor 480, and a resistive element 422 may be coupled between Vb and the gate of transistor 482. In some aspects, the circuit 414 may be omitted or the configuration thereof may be different, for example based on the configuration of the DA core circuit 412.

In certain aspects, the DA load circuit 402 may include a transformer 430 (e.g., configured as a balanced-unbalanced (balun) transformer). A tap 434 (e.g., center tap) of the primary winding 432 of the transformer 430 may be coupled to a voltage rail Vdd, as illustrated. The secondary winding 436 of the transformer 430 may be coupled to an output 439 of the DA 400, as illustrated. As shown, one terminal of the secondary winding 436 may be coupled to electric ground to provide a single-ended output (e.g., output 439) on the secondary side of the transformer 430. As described above with respect to FIG. 3, the output of the DA may be coupled to an input of a PA (e.g., the PA 316). The PA may include a single-ended input, and the transformer 430 may be configured to convert differential signaling in the DA 400 into a single-ended signal which is provided to the PA. In some cases, an attenuator 438 may be coupled between the secondary winding 436 and the output 439 of the DA 400. In certain aspects, a variable resistance circuit 450 may be coupled in parallel with the primary winding 432. In some aspects, the variable resistance circuit 450 may be adjusted for impedance matching to improve the VSWR associated with the DA 400, as described herein.

Figure 5:
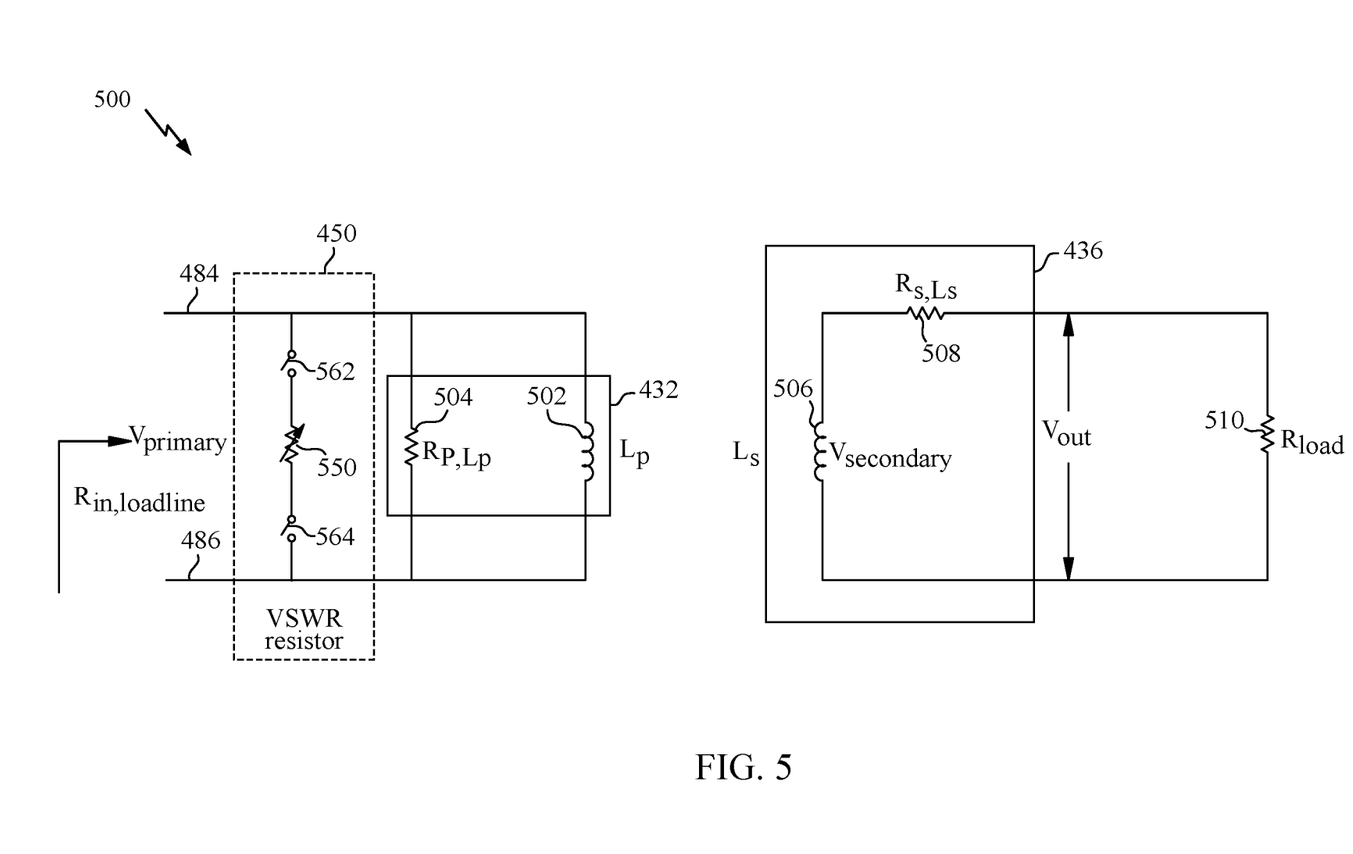
FIG. 5 illustrates a DA load circuit including a variable resistance circuit, in accordance with certain aspects of the present disclosure.

FIG. 5 illustrates the DA load circuit 402 including the variable resistance circuit 450, in accordance with certain aspects of the present disclosure. The primary winding 432 is represented by inductive element 502 (with primary inductance $L_p$), and may have a parallel parasitic resistance represented by the resistive element 504 ($R_{P,Lp}$). The secondary winding 436 is represented by inductive element 506 (with secondary inductance $L_s$), and may have a series parasitic resistance represented by the resistive element 508 ($R_{s,Ls}$). As illustrated, a load may be coupled to the secondary winding 436, represented by resistive element 510 ($R_{load}$).

In some aspects, the variable resistance circuit 450 may include one or more resistive elements, such as resistive element 550. The resistive element 550 may be selectively coupled in parallel with the primary winding 432 via one or more switches, such as switches 562, 564. In some aspects, the variable resistance circuit 450 may be a resistor bank having multiple segments in parallel with the primary winding, each of the segments having one or more resistive elements and one or more switches. The one or more switches of each segment may be controlled such that the one or more resistive elements of that segment may be selectively coupled in parallel with the primary winding, in effect setting the resistance of the variable resistance circuit 450. In some aspects, a similar variable resistance circuit (not shown) may also be coupled between terminals of the secondary winding of the transformer, or between a signal line coupled to the secondary winding and ground, to provide further means for impedance matching to improve VSWR.

Figure 6:
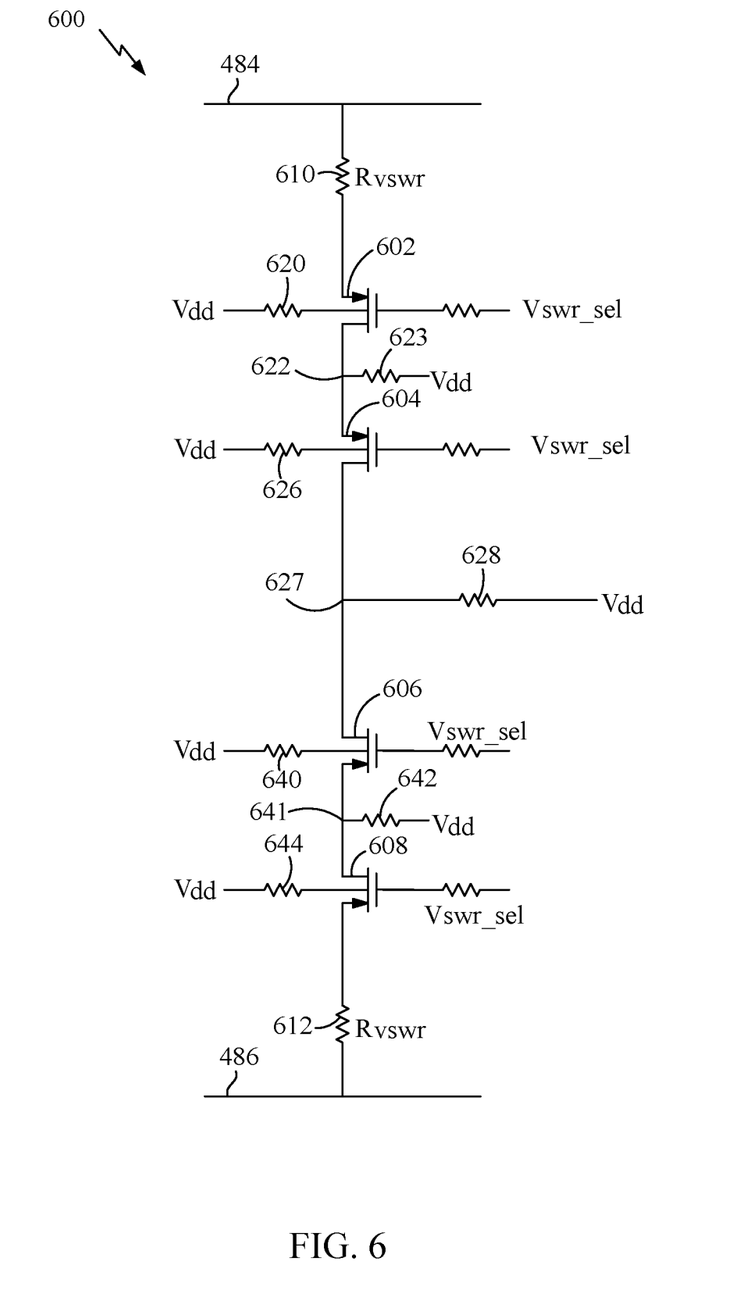
FIG. 6 illustrates a segment of a variable resistance circuit, in accordance with certain aspects of the present disclosure.

FIG. 6 illustrates a segment of the variable resistance circuit 450, in accordance with certain aspects of the present disclosure. As illustrated, the segment 600 includes switches 602, 604, 606, 608, and resistive elements 610, 612 for managing VSWR. Each of the switches 602, 604, 606, 608 may be implemented using a p-type metal-oxide-semiconductor (PMOS) transistor, as illustrated. NMOS implementations may also be used.

In certain aspects, a node between any two adjacent switches in the segment 600 may be coupled to Vdd through a resistive element such that the node is not floating when the switches 602, 604, 606, 608 are open. For example, the node 622 may be coupled to Vdd through resistive element 623, the node 627 is coupled to Vdd through resistive element 628, and node 641 is coupled to Vdd through resistive element 642.

Moreover, the bulk of the transistors in the segment 600 may also be coupled to Vdd through resistive elements. For example, the bulk of the transistor associated with switch 602 is coupled to Vdd through resistive element 620, the bulk of the transistor associated with switch 604 is coupled to Vdd through resistive element 626, the bulk of the transistor associated with switch 606 is coupled to Vdd through resistive element 640, and the bulk of the transistor associated with switch 608 is coupled to Vdd through resistive element 644. The switches 602, 604, 606, 608 may be controlled via VSWR selection signals (Vswr_sel). While a single segment of the variable resistance circuit 450 is illustrated in FIG. 6, the variable resistance circuit 450 may include one or more segments. The switches of each segment may be controlled by a separate VSWR selection signal (e.g., VSWR selection signal 0 to VSWR selection signal n, n being an integer equal to or greater than 1) to adjust the resistance associated with the variable resistance circuit 450. While the segment 600 includes four switches 602, 604, 606, 608 and two resistive elements 610, 612 for managing VSWR, any suitable number of switches and resistive elements may be used. For example, the segment 600 may include a single switch and a single resistive element. In some aspects, the segment 600 may include two switches and two resistive elements. For instance, the segment 600 may include one switch and one resistive element between node 627 and node 484, and may include another switch and another resistive element between node 627 and node 486.

Figure 7:
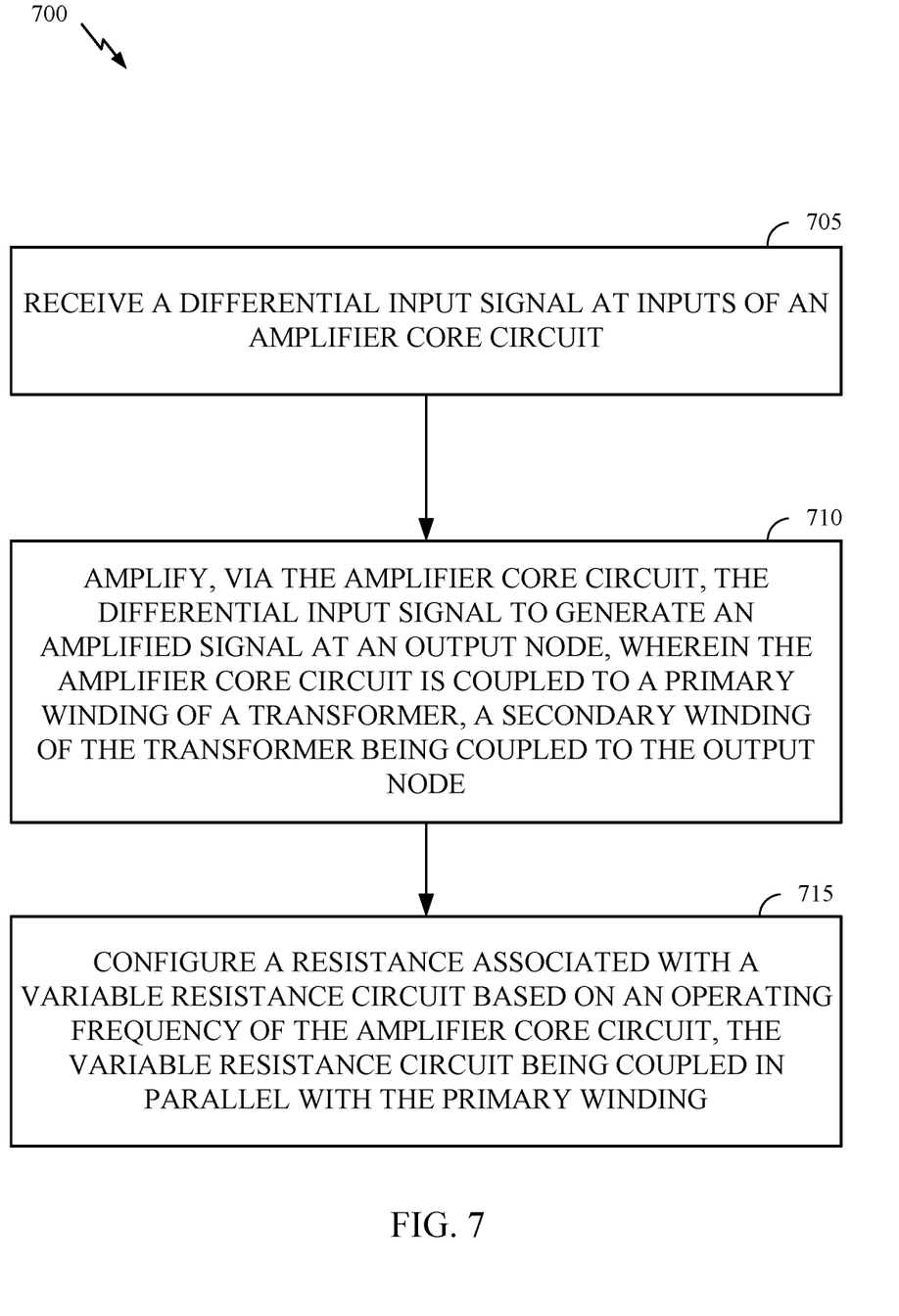
FIG. 7 is a flow diagram depicting example operations for generating an amplified signal, in accordance with certain aspects of the present disclosure.

FIG. 7 is a flow diagram depicting example operations 700 for generating an amplified signal, in accordance with certain aspects of the present disclosure. The operations 700 may be performed by an amplification system.

The operations 700 begin at block 705 with the amplification system receiving a differential input signal at inputs (e.g., 480 and 482) of an amplifier core circuit (e.g., DA core circuit 412), and at block 710, amplifying, via the amplifier core circuit, the differential input signal to generate the amplified signal at an output node. In certain aspects, the amplifier core circuit is coupled to a primary winding (e.g., primary winding 432) of a transformer (e.g., transformer 430), a secondary winding (e.g., secondary winding 436) of the transformer being coupled to the output node. At block 715, the amplification system configures a resistance associated with a variable resistance circuit (e.g., variable resistance circuit 450) based on an operating frequency of the amplifier core circuit, the variable resistance circuit being coupled in parallel with the primary winding. For example, the amplification system may configure a higher resistance associated with the variable resistance circuit at higher operating frequencies of the amplifier core circuit. In other words, if a higher frequency band is to be used for communication, the variable resistance circuit may be configured with the higher resistance accordingly (e.g., by closing switches 602, 604, 606, 608). When the operating frequency changes (e.g., increases), the resistance associated with the variable resistance circuit may be changed (e.g., increased) for impedance matching at the new operating frequency, decreasing the VSWR associated with the amplifier core circuit.

In certain aspects, the variable resistance circuit may include one or more resistive elements (e.g., resistive element 550, or resistive elements 610, 612). In some aspects, configuring the resistance associated with the variable resistance circuit may include selectively coupling the one or more resistive elements in parallel with the primary winding. In some cases, the one or more resistive elements comprise a plurality of resistive elements.

In some aspects, the one or more resistive elements may include a first resistive element (e.g., resistive element 610) in a segment (e.g., segment 600) in parallel with the primary winding, and a second resistive element (e.g., resistive element 612) in the segment. In certain aspects, the first resistive element and the second resistive element are selectively coupled in parallel with the primary winding via one or more switches of the segment.

In some aspects, the one or more resistive elements may include a first resistive element (e.g., resistive element 610) in a first segment (e.g., segment 600), and a second resistive element in a second segment. In certain aspects, the first resistive element and the second resistive element are each selectively coupled (e.g., the coupling for each resistive element may be separately or independently controlled) in parallel with the primary winding via one or more switches of the respective segment.

In some implementations, the one or more switches may include one or more first switches (e.g., switches 602, 604) coupled between a first terminal of the primary winding and a node (e.g., node 627), and one or more second switches (e.g., switches 606, 608) coupled between a second terminal of the primary winding and the node. In some aspects, a resistive element (e.g., resistive element 620) is coupled between a voltage rail and a bulk of each of the one or more first switches and the one or more second switches. In some aspects, a resistive element (e.g., resistive element 628) is coupled between the node and a voltage rail.

In some aspects, a tap (e.g., center tap) of the primary winding is coupled to a voltage rail. In certain implementations, the resistance associated with the variable resistance circuit is configured to decrease a voltage standing wave ratio (VSWR) associated with the amplifier.

In certain aspects, a first input signal of the differential input signal may be received at a gate of a first transistor (e.g., transistor 408) of the amplifier core circuit, a drain of the first transistor being coupled to a first terminal of the primary winding. A second input signal of the differential input signal may also be received at a gate of a second transistor (e.g., transistor 410) of the amplifier core circuit, a drain of the second transistor being coupled to a second terminal of the primary winding. In certain aspects, a third transistor (e.g., transistor 404) is coupled between the first transistor and the first terminal of the primary winding, and a fourth transistor (e.g., transistor 406) may be coupled between the second transistor and the second terminal of the primary winding.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An amplifier, comprising:
   an amplifier core circuit configured to amplify a radio frequency signal and having a first output and a second output;
   a transformer coupled to the amplifier core circuit, the transformer having a primary winding and a secondary winding, the primary winding being coupled to the first output and the second output of the amplifier core circuit, the secondary winding being coupled to an output node of the amplifier; and
   a variable resistance circuit coupled in parallel with the primary winding,
   wherein the output node is coupled to an input of another amplifier, and
   wherein the amplifier comprises a driver amplifier in a transmit path of a user terminal, the other amplifier comprises a power amplifier in the transmit path, and the transformer comprises a balun configured to convert differential signaling in the driver amplifier into a single-ended output, the single-ended output being coupled to a single-ended input of the power amplifier.

2. The amplifier of claim 1, wherein the variable resistance circuit comprises one or more resistive elements selectively coupled in parallel with the primary winding.

3. The amplifier of claim 2, wherein the one or more resistive elements comprise a plurality of resistive elements, each of the plurality of resistive elements being selectively coupled in parallel with the primary winding, and wherein at least one resistive element of the plurality of resistive elements is configured to be coupled in parallel with the primary winding independent of whether at least one other resistive element of the plurality of resistive elements is coupled in parallel with the primary winding.

4. The amplifier of claim 2, wherein the one or more resistive elements comprise:
   a first resistive element in a segment of the variable resistance circuit in parallel with the primary winding; and
   a second resistive element in the segment.

5. The amplifier of claim 4, wherein the segment comprises one or more switches, the first resistive element and the second resistive element being selectively coupled in parallel with the primary winding via the one or more switches.

6. The amplifier of claim 5, wherein the one or more switches comprise:
   one or more first switches coupled between a first terminal of the primary winding and a node; and
   one or more second switches coupled between a second terminal of the primary winding and the node.

7. The amplifier of claim 6, wherein the variable resistance circuit further comprises a resistive element coupled between a voltage rail and a bulk of each of the one or more first switches and the one or more second switches.

8. The amplifier of claim 6, wherein the one or more first switches comprise multiple switches, the variable resistance circuit further comprising a resistive element coupled between a voltage rail and a node between the multiple switches.

9. The amplifier of claim 6, wherein the variable resistance circuit further comprises a resistive element coupled between the node and a voltage rail.

10. The amplifier of claim 1, wherein a tap of the primary winding is coupled to a voltage rail.

11. The amplifier of claim 10, wherein the tap comprises a center tap of the primary winding.

12. The amplifier of claim 1, wherein the amplifier core circuit comprises:
    a first transistor having a gate coupled to a first input of a differential input pair of the amplifier, a drain of the first transistor being coupled to the first output of the amplifier core circuit, the first output being coupled to a first terminal of the primary winding; and
    a second transistor having a gate coupled to a second input of the differential input pair, a drain of the second transistor being coupled to the second output of the amplifier core circuit, the second output being coupled to a second terminal of the primary winding.

13. The amplifier of claim 12, wherein the amplifier core circuit further comprises:
    a third transistor coupled between the first transistor and the first terminal of the primary winding, the third transistor comprising a drain directly connected to a first node of the primary winding and a first node of the variable resistance circuit; and
    a fourth transistor coupled between the second transistor and the second terminal of the primary winding, the fourth transistor comprising a drain directly connected to a second node of the primary winding and a second node of the variable resistance circuit.

14. The amplifier of claim 1, further comprising first and second capacitors and first and second resistors, wherein a first terminal of the first and second capacitors are coupled to a mixer, wherein a second terminal of the first and second capacitors are coupled to respective inputs of the amplifier core circuit, wherein a first resistor is coupled between the second terminal of the first capacitor and a node, wherein the second resistor is coupled between the second terminal of the second capacitor and the node, and wherein the node is further coupled to a bias voltage.

15. The amplifier of claim 1, wherein an input of the amplifier core circuit is coupled to a mixer, the mixer being configured to receive an intermediate frequency signal and output the radio frequency signal.

16. A method for generating an amplified signal, comprising:
    receiving a differential input signal at inputs of an amplifier core circuit;
    amplifying, via the amplifier core circuit, the differential input signal to generate the amplified signal at an output node, wherein the amplifier core circuit is coupled to a primary winding of a transformer, a secondary winding of the transformer being coupled to the output node; and
    configuring a resistance associated with a variable resistance circuit based on an operating frequency of the amplifier core circuit, the variable resistance circuit being coupled in parallel with the primary winding,
    wherein the variable resistance circuit comprises one or more resistive elements in one or more segments, at least one of the one or more segments including a plurality of switches, wherein configuring the resistance associated with the variable resistance circuit comprises selectively coupling the one or more resistive elements in parallel with the primary winding, and wherein the selectively coupling comprises controlling the plurality of switches.

17. The method of claim 16, wherein the resistance associated with the variable resistance circuit is configured to decrease a voltage standing wave ratio (VSWR).

18. An amplifier, comprising:
    an amplifier core circuit configured to amplify a radio frequency signal and having a first output and a second output;
    a transformer coupled to the amplifier core circuit, the transformer having a primary winding and a secondary winding, the primary winding being coupled to the first output and the second output of the amplifier core circuit, the secondary winding being coupled to an output node of the amplifier;
    a variable resistance circuit coupled in parallel with the primary winding; and
    first and second capacitors and first and second resistors, wherein a first terminal of the first and second capacitors are coupled to a mixer, wherein a second terminal of the first and second capacitors are coupled to respective inputs of the amplifier core circuit, wherein a first resistor is coupled between the second terminal of the first capacitor and a node, wherein the second resistor is coupled between the second terminal of the second capacitor and the node, and wherein the node is further coupled to a bias voltage.

19. The amplifier of claim 18, wherein the variable resistance circuit comprises one or more resistive elements selectively coupled in parallel with the primary winding, and wherein the one or more resistive elements comprise:
- a first resistive element in a segment of the variable resistance circuit in parallel with the primary winding; and
- a second resistive element in the segment,
- wherein the segment comprises one or more switches, the first resistive element and the second resistive element being selectively coupled in parallel with the primary winding via the one or more switches, and wherein the one or more switches comprise:
- one or more first switches coupled between a first terminal of the primary winding and a node; and
- one or more second switches coupled between a second terminal of the primary winding and the node.

20. The amplifier of claim 19, wherein the one or more first switches comprise multiple switches, the variable resistance circuit further comprising a resistive element coupled between a voltage rail and a node between the multiple switches.

* * * * *